United States Patent
Reddy et al.

(10) Patent No.: US 6,292,416 B1
(45) Date of Patent: Sep. 18, 2001

(54) APPARATUS AND METHOD OF REDUCING THE PRE-CHARGE TIME OF BIT LINES IN A RANDOM ACCESS MEMORY

(75) Inventors: Chitranjan N. Reddy, Los Altos Hills; Subramani Kengeri, Cupertino, both of CA (US)

(73) Assignee: Alliance Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/025,290

(22) Filed: Feb. 11, 1998

(51) Int. Cl.[7] .................................................. G11C 7/00
(52) U.S. Cl. ........................ 365/203; 365/204; 365/202; 365/190; 365/207
(58) Field of Search .................................. 365/203, 204, 365/202, 190, 207

(56) References Cited

U.S. PATENT DOCUMENTS

| | | | |
|---|---|---|---|
| 4,914,634 | 4/1990 | Akrout et al. | 365/233 |
| 5,053,997 | 10/1991 | Miyamoto et al. | 365/189.06 |
| 5,148,399 | * 9/1992 | Cho et al. | 365/205 |
| 5,159,210 | * 10/1992 | Eitrheim et al. | 307/480 |
| 5,280,205 | * 1/1994 | Green et al. | 307/530 |
| 5,339,274 | * 8/1994 | Dhong et al. | 365/203 |
| 5,517,451 | 5/1996 | Okuzawa | 365/203 |
| 5,604,365 | * 2/1997 | Kajigaya et al. | 257/296 |
| 5,781,466 | * 7/1998 | Tanaka et al. | 365/49 |
| 5,825,699 | * 10/1998 | Tanaka et al. | 365/226 |
| 5,862,089 | * 1/1999 | Raad et al. | 365/203 |
| 5,881,005 | * 3/1999 | Otori et al. | 365/205 |

* cited by examiner

*Primary Examiner*—Viet Q. Nguyen
(74) *Attorney, Agent, or Firm*—Beyer Weaver & Thomas, LLP

(57) ABSTRACT

According to the first embodiment of the present invention, a pre-charge device is connected to the middle of each complementary bit line. Thus, once activated, the pre-charge device only drives a load equal to half of the RC impedance of the entire bit lines during the pre-charging operation. According to the second embodiment of the present invention, a first pre-charge device is connected to one end of each complementary bit lines and a second pre-charge device is connected approximately to the middle of each complementary bit lines. Once both devices are activated, each device drives a load equal to half of the RC impedance of the entire bit lines, thus reducing the pre-charge time of the bit lines.

20 Claims, 4 Drawing Sheets

APPARATUS AND METHOD OF REDUCING THE PRE-CHARGE TIME OF BIT LINES IN A RANDOM ACCESS MEMORY

BACKGROUND OF THE INVENTION

1. Field of the Invention

The present invention deals with Random Access Memories (RAMs). More specifically, the present invention deals with high performance DRAMs.

2. Discussion of the Related Art

A typical Random Access Memory (RAM) includes memory array and peripheral circuits. The memory array is typically arranged in rows and columns of memory cells. Each row of the memory cells can be accessed by activating a word line. Each column of the memory cells can be accessed by addressing a bit line. The bit lines are typically provided in pairs of complementary bit lines.

In operation, the externally applied address is decoded to generate signals to assert a selected word line and a selected column. The asserted word line will cause the data stored in the memory cells within the selected row to be placed on the corresponding pairs of bit lines. Thereafter, the data on the selected pair of bit lines will be sensed and placed on an I/O line.

It is well known to one knowledgeable in the art that before reading the content a memory cell, the bit lines associated with the memory cell must be pre-charged to a certain voltage level. For example in DRAM's, the pre-charge voltage level is typically equal to one half of the supply voltage. The time to pre-charge the bit lines is referred to as the pre-charge time. This time is critical in determining the read or write cycle time. Therefore, the faster the pre-charge time, the shorter is the read or write cycle.

The speed by which a bit line is pre-charged depends on the load that must be driven by the pre-charge circuit. This load is represented by the impedance of each bit line. The impedance of the bit lines is determined by its equivalent resistance and capacitance and the capacitance of the memory cells that are connected to it. The equivalent resistance and capacitance of a bit line are directly proportional to its length. The longer is the length bit line the higher is its equivalent resistance and capacitance.

In a high capacity random access memory, the number of memory cells connected to each bit line increase. Each memory cell has a finite capacitance. Thus, an increase in the number of memory cells connected to a bit line directly increases the total capacitance connected to the bit line.

Accordingly, in a high capacity random access memory, the impedance of the bit lines increases substantially. This means that the time that it takes for the pre-charge circuit to pre-charge a bit line increases substantially. This is not acceptable in a high performance and high capacity random access memory.

Accordingly, there is a need for a high capacity and high performance random access memory with shorter pre-charge time.

OBJECTIVES AND SUMMARY OF THE INVENTION

It is the object of the present invention to provide a RAM with a shorter pre-charge time.

According to the first embodiment of the present invention, a pre-charge device is coupled to the middle of each complementary bit line. Once the pre-charge device is activated, it shorts the middle of the bit lines together causing the voltage on the bit lines to be equal to half of the aggregate voltages on the bit lines before the activation of the pre-charge device. Furthermore, the pre-charge device drives a load that is half of the load represented by the RC impedance of the entire bit lines in each direction. Thus, the bit lines are pre-charged in a much shorter time.

According to the second embodiment of the present invention, a first pre-charge device is coupled to one end of each complementary bit line and a second pre-charge device is coupled to approximately the middle of each complementary bit line. Once both devices are activated, the bit lines are shorted together in two locations, at one end and in the middle. The shorting of the two bit lines causes the voltage on each bit line to a level equal to the half of the aggregate voltages of the two bit lines before the activation of the pre-charge devices. Furthermore, each pre-charge device drives a load equal to half of a load represented by the RC impedance of the entire bit lines. Thus, the pre-charge time is substantially reduced

DETAILED DESCRIPTION OF THE INVENTION

The present invention provides an apparatus and a method of reducing the pre-charge time in random access memories. The pre-charge time becomes significantly important in high capacity, high performance Random Access Memories.

Figure 1:
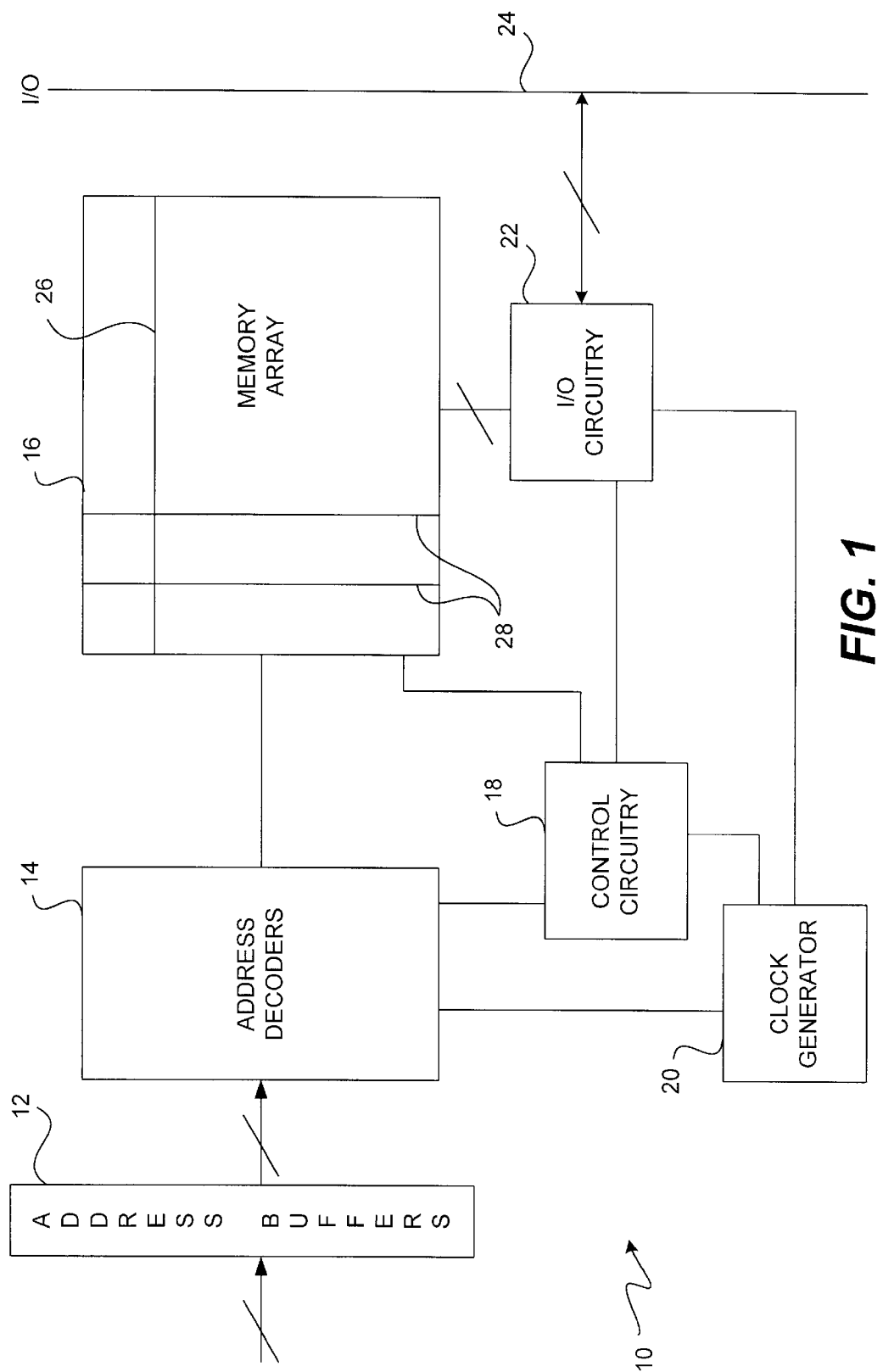
FIG. 1 is a block diagram of a random access memory according to the present invention.

FIG. 1 is a block diagram of a RAM 10 incorporating the present invention. Ram 10 includes address buffer 12, address decoder 14, memory array 16, control circuitry 18, clock generator 20, I/O circuitry 22, and I/O line 24. Memory array 16 includes memory cells (not shown) that are arranged in rows and columns. The intersection of each row and column defines a memory cell. Memory array 16 further includes word lines 26 and bit lines 28. Bit lines 28 are provided in pairs of complementary bit lines. For the sake of simplicity, one word line 26 and one pair of complementary bit lines 28 are shown in FIG. 1. However, memory array 16 can have as many word lines 26 as there are rows and as many complementary pairs of bit lines 28 as there are columns in the memory array 16.

Each memory cell within the memory array 16 is accessed by addressing the memory cell. The memory cell address is applied to address decoder 14 through address buffer 12. The memory cell address is then decoded by address decoder 14 to generate a word line select signal and a column select signal. The word line select signal activates all the memory cells in a selected row. Once the memory cells are activated, depending on the desired operation, i.e., a read or write operations, the content of the memory cells can either be read or information can be written in to one of the activated cells.

The column select signal generated by the address decoder 14 enables accessing the data present on the selected pairs of bit lines. In a read operation, the content of selected memory cell that is transferred to the associated pair of bit lines 28 is sensed and transferred to the I/O line 24. In a write operation, the data on the I/O line 24 is written in to the selected memory cell. As mentioned above, the bit lines must be precharged to a certain voltage level before they can be used to read the content of the memory cells or write in to the memory cells.

During a read operation, depending on the content of the addressed memory cell, the voltage level on the bit line (one of the two complementary bit lines) the memory cell is changed. The voltage on the other bit line remains at the pre-charge voltage level. For example, if the data stored in the addressed memory cell represents a logic "0", the voltage on the bit line connected to the memory cell, for example BL, will be changed by a voltage that represents a logic "0". The voltage on the other bit line, BL_, remains at the pre-charge voltage level, i.e., BLR level.

Similar to a read operation, in a write operation the voltage of one of the bit lines will be affected by the data that needs to be written in to the addressed memory cell. The voltage of the other bit line will remain at BLR level, which is half of the supply voltage.

Going back to a read operation, once the information stored in the selected memory is transferred on to the bit lines, it will be sensed by the sense amplifiers. The sensing process forces the voltage on the bit line that carries the information to supply or ground voltage and the voltage on the other bit line to a voltage opposite to the voltage on the first bit line. In the above example, the voltage on the BL will be equal to ground and the voltage on the BL_ will be equal to the supply voltage.

Figure 2:
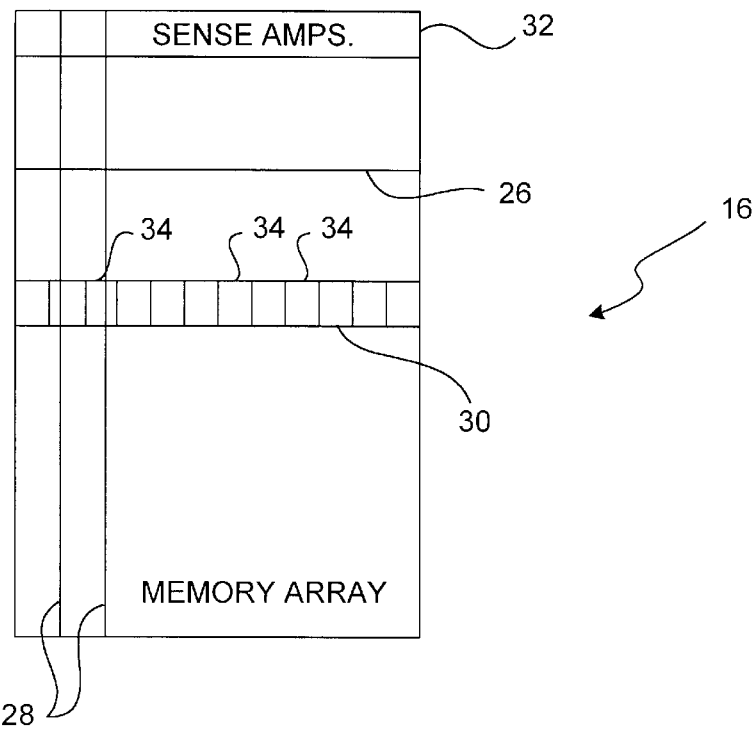
FIG. 2 is a block diagram of the memory array of FIG. 1 according to the first embodiment of the present invention.

FIG. 2 is a block diagram of the memory array 16 according to the first embodiment of the present invention. In addition to word line (WL) 26 and bit lines 28, memory array 16 includes pre-charge bank 30 and sense amplifier circuits 32. The pre-charge bank 30 includes a plurality of pre-charge devices 34. Each pre-charge device 34 has the task of pre-charging one corresponding complementary pair of bit lines before any operation, such as a read or write operation.

As described above, the pre-charge time depends on the equivalent RC impedance of the bit lines. Thus, the pre-charge time can be reduced by connecting the output of the pre-charge devices where it must drive a lower impedance. For example, if the output of a pre-charge device 34 is connected to either ends of the bit line, it must drive the entire RC impedance of the bit line; thus it takes longer to pre-charge the bit line.

In the embodiment of FIG. 2, the pre-charge devices are connected to the bit lines so that each must drive an impedance equal to half of the impedance of the entire corresponding bit lines; thus reducing the pre-charge time substantially. As it is illustrated in FIG. 2, the outputs of the pre-charge device 34 are connected to a point in the middle of the corresponding complementary bit lines.

By connecting the outputs of each pre-charge device 34 to the middle of the corresponding complementary bit lines, the present invention effectively reduces the impedance of the bit lines that must be driven by the pre-charge device 34 in each direction by half. Thus it takes substantially less time to pre-charge the bit lines. The first embodiment of the present invention reduces the prior art pre-charge time by approximately 30–40 percent. This is a substantial improvement, specially, where high performance memories are concerned. The first embodiment of the present invention can be described more clearly with reference to FIG. 3.

Figure 3:
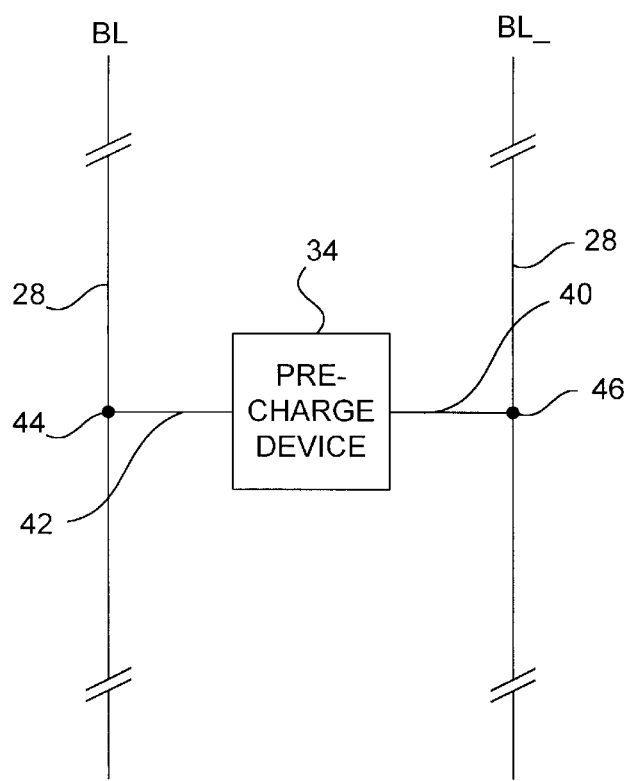
FIG. 3 is a schematic diagram illustrating how the pre-charge circuitry is connected to the bit lines according to the first embodiment of the present invention

FIG. 3 is a schematic diagram illustrating the connection of the pre-charge device 34 to the complementary pair of bit lines 28 according to the first embodiment of the present invention. The circuit of FIG. 3 includes a pair of complementary bit lines BL 28 and BL_ 28 and a pre-charge device 34. The pre-charge device 34 includes two outputs 40 and 42. Outputs 40 and 42 are connected to points 44 and 46 in the middle of BL and BL_, respectively.

In operation, once pre-charge device 34 is enabled it performs two functions. First, it shorts the two bitlines together by connecting point 44 to point 446. As mentioned above, after the sensing stage in a read or write operation, the voltage on one of the bit lines is equal to the supply voltage and the voltage on the other bit line is equal to ground. When the two bit lines are shorted together, their respective voltage potential will be forced to a voltage level equal to the average of the voltages on the bit lines prior to the shorting. However, because of the inherent RC impedance of the bit lines, it takes a long time for the voltage to settle to the target voltage, which is half of the supply voltage. The second task of the pre-charge device 34 takes care of this problem.

The second task of the pre-charge device 34 is to speed up the process of pre-charge the bit lines 28 to the target pre-charge voltage level by driving the two bit lines hard. Since the outputs of the pre-charge device 34 are connected to the middle of the bit lines 28, each output must now drive an impedance equal to half of the total impedance of each bit line in each direction. Accordingly, the two bit lines will be pre-charged in a shorter time.

Figure 4:
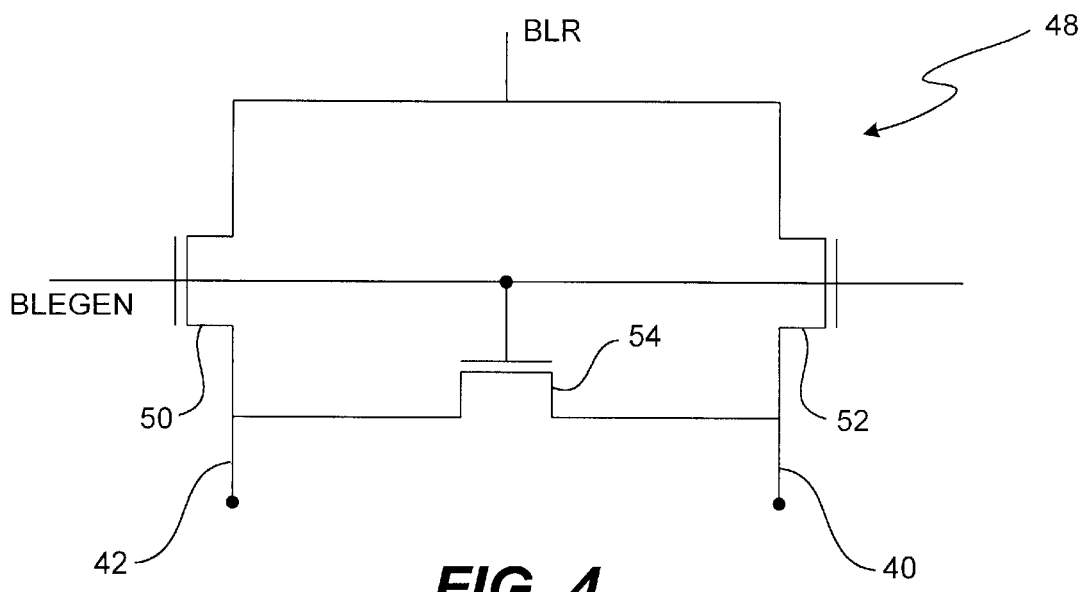
FIG. 4 is an example of a pre-charge device used in the present invention.
Figure 5:
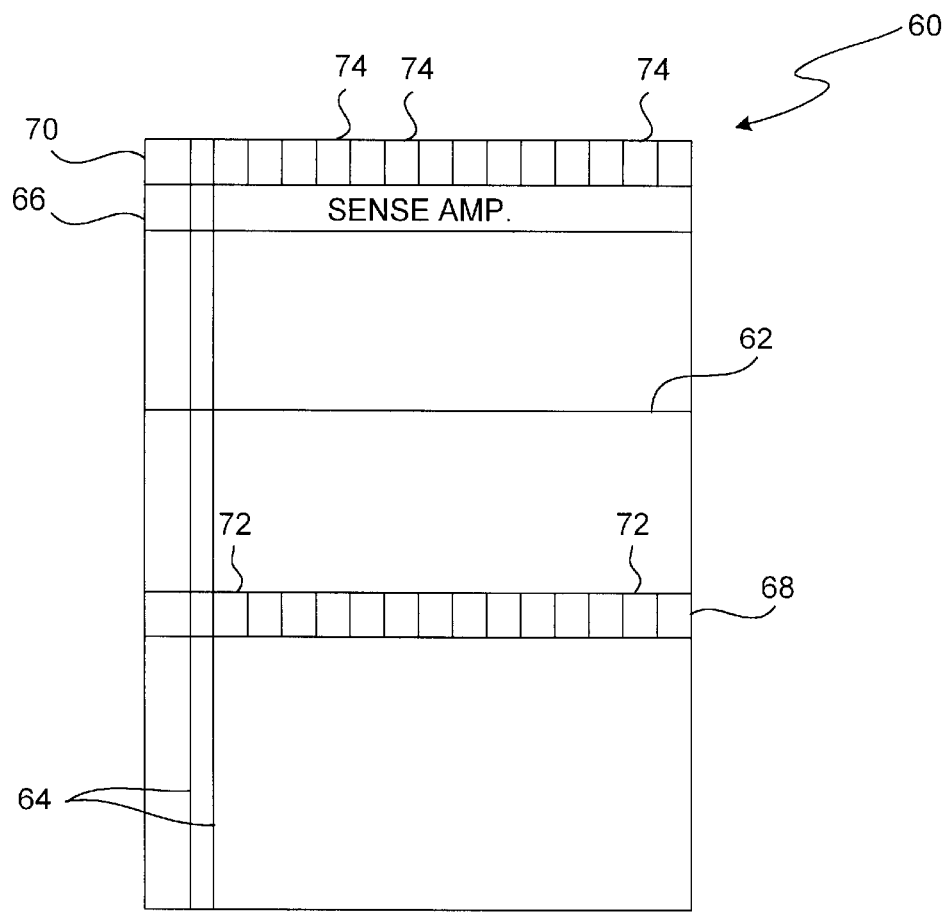
FIG. 5 is a block diagram of the memory array in FIG. 1 according to the second embodiment of the present invention.

FIG. 4 is the schematic diagram of an example of a pre-charge device 34. The precharge circuit 48 of FIG. 4 includes three MOS transistors 50–54 that are connected as shown in FIG. 5. The drains of transistors 50 and 52 are connected to the desired pre-charge voltage designated by BLR in FIG. 4. As mentioned before, the pre-charge voltage is typically equal to Vcc/2. The sources of transistors 40 and 42 are connected to the drain and source of transistor 54 respectively. The outputs 56 and 58 of pre-charge circuit 48 are the drain and source of transistor 54. The gates of all three transistors are connected to the Bit Line Equalization Enable (BLEQEN). Although N channel MOS transistors are shown in FIG. 4, it is understood that P channel MOS transistors could also be used in the circuit of FIG. 4.

In operation, when the BLEQEN line goes high, all three transistors begin to conduct, shorting point 44 to point 46 and connecting the BLR voltage to points 46 and 48. The rest of the operation of pre-charge circuit 48 in FIG. 4 is explained above.

It should be mentioned that the embodiment of FIGS. 2 and 3 is an illustrative embodiment, and one knowledgeable in the art realizes that a typical random access memory includes more than one pair of complementary bit lines and one pre-charge device for each pair of bit lines.

FIG. 5 is a second embodiment of the memory array 16 according to the present invention. Memory array 60 includes memory cells (not shown), word lines 62, bit lines 64, a sense amplifier bank 66, a first pre-charge bank 68, and a second pre-charge bank 70. The first pre-charge bank 66 includes a plurality of first pre-charge devices 72. The second pre-charge bank 70 includes a plurality of second pre-charge devices 74. In accordance with the second embodiment of the present invention, one first pre-charge device 72 and one second pre-charge device 74 are associated with each pair of complementary bit lines in memory array 60. The second embodiment of the present invention can be better described with reference to the schematic of FIG. 6.

Figure 6:
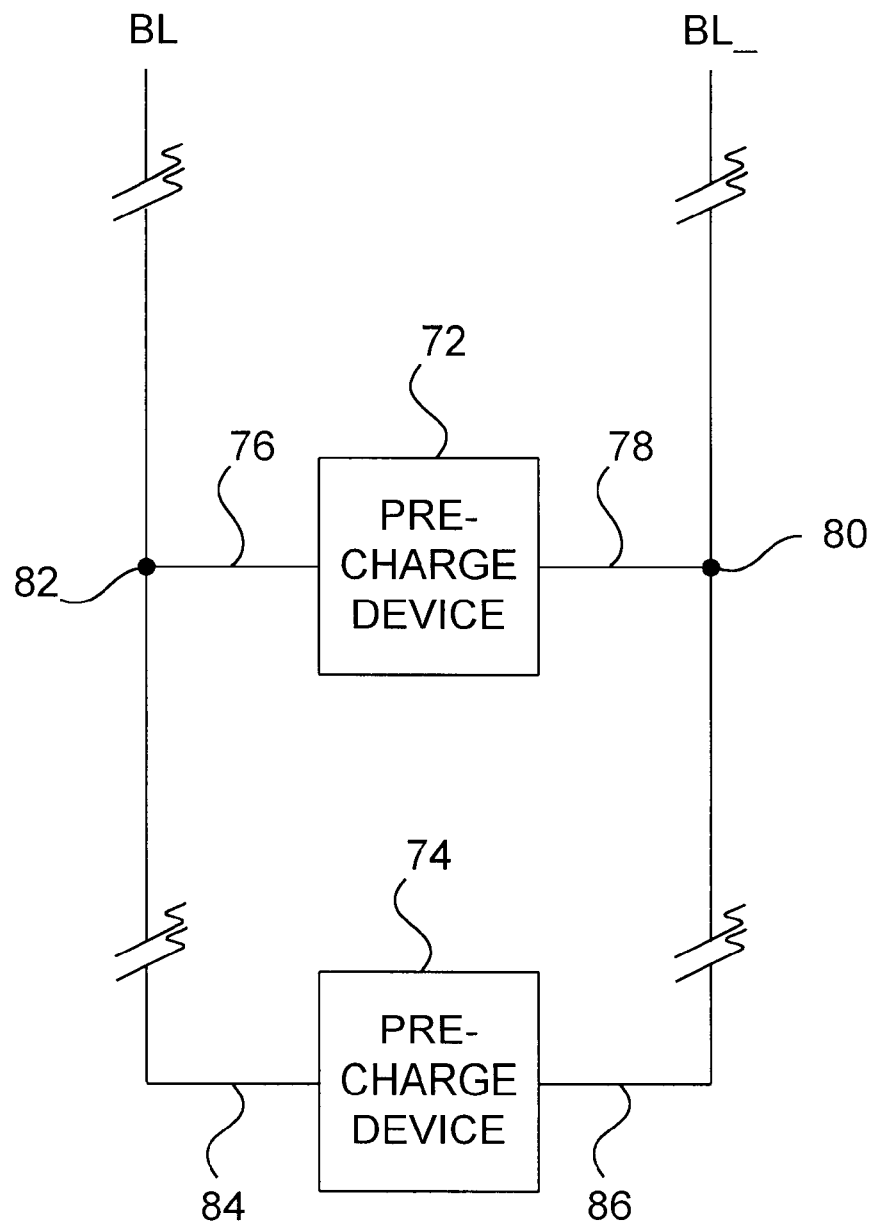
FIG. 6 is a schematic diagram illustrating how the pre-charge circuitry is connected to the bit lines according to the second embodiment of the present invention.

FIG. 6 is a schematic diagram illustrating the connection of the first and second pre-charge devices to the complementary pair of bit lines in accordance with the second embodiment of the present invention. The schematic of FIG. 6 includes a pair of bit lines 28 (BL and BL_), a first pre-charge device 72 connected approximately to the middle of the bit lines 28, and a second pre-charge 74 connected to one end of the bit lines 28. The first pre-charge device 72 includes two output terminals 76 and 78 that are connected to points 80 and 82, respectively. The second pre-charge device 74 includes two output terminals 84 and 86 that are connected to the end of BL and BL_, respectively. Points 80 and 82 are located approximately in the middle of bit lines BL_ and BL, respectively.

In operation, to pre-charge BL and BL-, both pre-charge devices 72 and 74 are enabled. Similar to pre-charge device 34, enabling pre-charge devices 72 and 74 serves two purposes. First, the two bit lines are shorted together at two different locations. Enabling pre-charge device 74 causes the ends of the bit lines 28 be shorted together and enabling pre-charge device 72 causes the shorting of points 80 to point 82.

As discussed above, after the sensing stage in a read or write operation, the voltage on one of the bit lines is equal to the supply voltage and the voltage on the other bit line is equal to ground. When the two bit lines are shorted together, their respective voltage potential will be forced to a potential level equal to the average of voltages on the bit lines prior to the shorting. However, because of the inherent RC impedance of the bit lines, it takes a long time for the voltage to settle to the target voltage, which is half of the supply voltage. The second task of the pre-charge devices 72 and 74 takes care of this problem.

Once the two bit lines are shorted together, the two pre-charge circuits 72 and 74 take over the task of forcing the voltages on the two bit lines to the target voltage level by driving the bitlines hard. Since each of the pre-charge devices must drive only half of the load, i.e., the load represented by half of the length of each bit line, they are able to pre-charge the bit lines much faster than if either was to drive the load represented by the entire length of the bit lines. The second embodiment of the present invention reduces the precharge time by at least 45 percent. Again this is extremely important in the design of high performance memories.

Pre-charge devices 72 and 74 could be implemented by the pre-charge circuit 48 in FIG. 4. Alternatively, the second pre-charge device 74 could be implemented by the pre-charge circuit of FIG. 4 and the first pre-charge device 72 could be a shorting device, such as an MOS transistor with its drain and source connected to points 80 and 82, respectively. The gate would be connected to the BLEQEN signal line. Once the BLEQEN is activated, it activates the transistor, thereby connecting its drain to its source. One knowledgeable in the art realizes that the pre-charge devices can be implemented by other suitable circuits.

It should be mentioned that the embodiment of FIGS. 5 and 6 is an illustrative embodiment, and one knowledgeable in the art realizes that a typical random access memory includes more than one pair of complementary bit lines and one pre-charge device for each pair of bit lines.

It should be understood that various alternatives to the embodiments of the invention described herein may be employed in practicing the invention. For example, an alternative to the embodiment of FIG. 6 is to connect the pre-charge devices 72 and 74 to the opposite end of the bit lines.

It is intended that the following claims define the scope of the invention and that methods and structures within the scope of these claims and their equivalents be covered thereby.

What is claimed is:

1. A random access memory having a memory array, said memory array including memory cells arranged in rows and columns, wherein each intersection of a row and a column defines a memory cell, the random access memory comprising:

a plurality of bit lines in said memory array, the bit lines being arranged in complementary bit line pairs; and a plurality of pre-charge devices each coupled to one of said pairs of complementary bit lines approximately half way between both ends of said bit lines.

2. The random access memory of claim 1 further comprising a second plurality of pre-charge devices each coupled to one end of one of said plurality of complementary bit line pairs.

3. The random access memory of claim 1, wherein each of said plurality of pre-charge devices includes:

a first MOS transistor having a drain coupled to a first voltage, a source and a gate coupled to a control signal;

a second MOS transistor having a drain coupled to the drain of the first MOS transistor, a source, and a gate coupled to the control signal; and a third MOS transistor having a drain coupled to the source of the first MOS transistor, a source coupled to the source of the second MOS transistor, and a gate coupled to the control signal, wherein the source and drain of said third transistor represent the output of said pre-charge device.

4. The random access memory of claim 2, wherein each of said plurality device includes a shorting devices.

5. The random access memory of claim 4, wherein said shorting device includes an MOS transistor.

6. The random access memory of claim 2, wherein each of said plurality of second pre-charge devices includes:

a first MOS transistor having a drain coupled to a first voltage, a source and a gate coupled to a control signal;

a second MOS transistor having a drain coupled to the drain of the first MOS transistor, a source, and a gate coupled to the control signal; and a third MOS transistor having a drain coupled to the source of the first MOS transistor, a source coupled to the source of the second MOS transistor, and a gate coupled to the control signal, wherein the source and drain of said third transistor represent the output of said second pre-charge device.

7. A random access memory having a memory array, said memory array including memory cells arranged in rows and columns, wherein each intersection of a row and a column defines a memory cell, the random access memory comprising:

a plurality of bit lines in said memory array, the bit lines being arranged in complementary bit line pairs;

a plurality of first pre-charge devices each coupled to one end of one of said plurality of complementary bit lines; and a plurality of second pre-charge devices each coupled to one of said pairs of complementary bit lines approximately half way between both ends of said bit lines.

8. The random access memory of claim 7, wherein each of said first and second plurality of pre-charge devices includes:

a first MOS transistor having a drain coupled to a first voltage, a source and a gate coupled to a control signal;

a second MOS transistor having a drain coupled to the drain of the first MOS transistor, a source, and a gate coupled to the control signal; and a third MOS transistor having a drain coupled to the source of the first MOS transistor, a source coupled to the source of the second MOS transistor, and a gate coupled to the control signal, wherein the source and drain of said third transistor represent the output of each of said first and second plurality of pre-charge devices.

9. The random access memory of claim 7, wherein each of said second pre-charge devices includes a shorting device.

10. The random access memory of claim 9, wherein each of said first plurality of pre-charge devices includes:

a first MOS transistor having a drain coupled to a first voltage, a source and a gate coupled to a control signal;

a second MOS transistor having a drain coupled to the drain of the first MOS transistor, a source, and a gate coupled to the control signal; and a third MOS transistor having a drain coupled to the source of the first MOS transistor, a source coupled to the source of the second MOS transistor, and a gate coupled to the control signal, wherein the source and drain of said third transistor represent the output of said first pre-charge device.

11. The random access memory of claim 9, wherein said shorting device include an MOS transistor.

12. In a random access memory having a memory array, said memory array including memory cells arranged in rows and columns, wherein each intersection of a row and a column defines a memory cell, said memory array further including a plurality of complementary pairs of bit lines, a pre-charge circuitry comprising:

a plurality of first charge circuits, coupled to one end of one of said complementary pairs of bit lines; and a plurality of second charge circuits; each coupled to said one of said complementary pairs of bit lines approximately half way between the ends of said one of said complementary bit lines.

13. The random access memory of claim 12, wherein each of said plurality of first and second charge circuits includes:

a first MOS transistor having a drain coupled to a first voltage, a source and a gate coupled to a control signal;

a second MOS transistor having a drain coupled to the drain of the first MOS transistor, a source, and a gate coupled to the control signal; and a third MOS transistor having a drain coupled to the source of the first MOS transistor, a source coupled to the source of the second MOS transistor, and a gate coupled to the control signal, wherein the source and drain of said third transistor represent the output of said first and second charge circuits.

14. The random access memory of claim 12, wherein each of said plurality of first charge circuits includes:

a first MOS transistor having a drain coupled to a first voltage, a source and a gate coupled to a control signal;

a second MOS transistor having a drain coupled to the drain of the first MOS transistor, a source, and a gate coupled to the control signal; and a third MOS transistor having a drain coupled to the source of the first MOS transistor, a source coupled to the source of the second MOS transistor, and a gate coupled to the control signal, wherein the source and drain of said third transistor represent the output of said first charge circuit.

15. The pre-charge circuitry of claim 14, wherein each of said plurality of second charge circuits circuits includes MOS transistors.

16. In a random access memory having a plurality of complementary bit lines, a method of reducing the pre-charge time of said bit lines comprising the steps of coupling a charge circuit to each of said complementary bit lines; said charge circuit being coupled to the complementary bit lines approximately half way between the ends of the complementary bit lines.

17. The method of claim 16, wherein said charge circuit includes:

a first MOS transistor having a drain coupled to a first voltage, a source and a gate coupled to a control signal;

a second MOS transistor having a drain coupled to the drain of the first MOS transistor, a source, and a gate coupled to the control signal; and a third MOS transistor having a drain coupled to the source of the first MOS transistor, a source coupled to the source of the second MOS transistor, and a gate coupled to the control signal, wherein the source and drain of said third transistor represent the output of said charge circuit.

18. The method of claim 16 further comprising the step of coupling a second charge circuit to one end of said complementary bit lines.

19. The method of claim 18, wherein each of said charge circuit and second charge circuit includes:

a first MOS transistor having a drain coupled to a first voltage, a source and a gate coupled to a control signal;

a second MOS transistor having a drain coupled to the drain of the first MOS transistor, a source, and a gate coupled to the control signal; and a third MOS transistor having a drain coupled to the source of the first MOS transistor, a source coupled to the source of the second MOS transistor, and a gate coupled to the control signal.

20. The method of claim 18, wherein said charge circuit includes an MOS transistor; and said second charge circuit includes a first MOS transistor having a drain coupled to a first voltage, a source and a gate coupled to a control signal, a second MOS transistor having a drain coupled to the drain of the first MOS transistor, a source, and a gate coupled to the control signal, and a third MOS transistor having a drain coupled to the source of the first MOS transistor, a source coupled to the source of the second MOS transistor, and a gate coupled to the control signal.

* * * * *